United States Patent [19]

Olson

[11] 4,308,468
[45] Dec. 29, 1981

[54] DUAL-FET SAMPLE AND HOLD CIRCUIT
[75] Inventor: Gaylord G. Olson, Culver City, Calif.
[73] Assignee: Xerox Corporation, Stamford, Conn.
[21] Appl. No.: 94,518
[22] Filed: Nov. 15, 1979
[51] Int. Cl.³ ............................................. H03K 5/153
[52] U.S. Cl. ...................................... 307/353; 307/572
[58] Field of Search ................. 307/251, 353; 328/151

[56] References Cited
U.S. PATENT DOCUMENTS

| | | | |
|---|---|---|---|
| 3,586,880 | 6/1971 | Fitzwater | 307/238 |
| 3,719,832 | 3/1973 | Waaben | 328/151 X |
| 4,048,525 | 9/1977 | Goldberg et al. | 307/353 |

FOREIGN PATENT DOCUMENTS 52-22871  2/1977  Japan .................... 307/353

OTHER PUBLICATIONS

"Improved Sample & Hold", *Electronic (G.B.)*, No. 50, Apr. 25, 1974, p. 53.

"Analog Switches and Their Applications", Siliconix Incorporated, 1976, pp. 4-18 to 4-19.

*Primary Examiner*—James B. Mullins
*Attorney, Agent, or Firm*—Robert E. Cunha

[57] ABSTRACT

An improved sample and hold circuit is disclosed. One field effect transistor (FET) is used as a switch between a variable input voltage connected to the source and a holding capacitor connected to the drain on the output line. The sampling pulse is applied to the gate, and is unavoidably coupled through the gate-to-drain capacitance to become a noise pulse on the output line. To cancel this pulse, a second compensating FET is provided. The sources and drains of these FETs are connected and the gate of the second FET receives a sampling pulse of opposite polarity. The second FET is biased off but the gate pulse is coupled through the source and drain capacitance to the first FET where it is used to cancel the original noise pulse on the output line.

8 Claims, 3 Drawing Figures

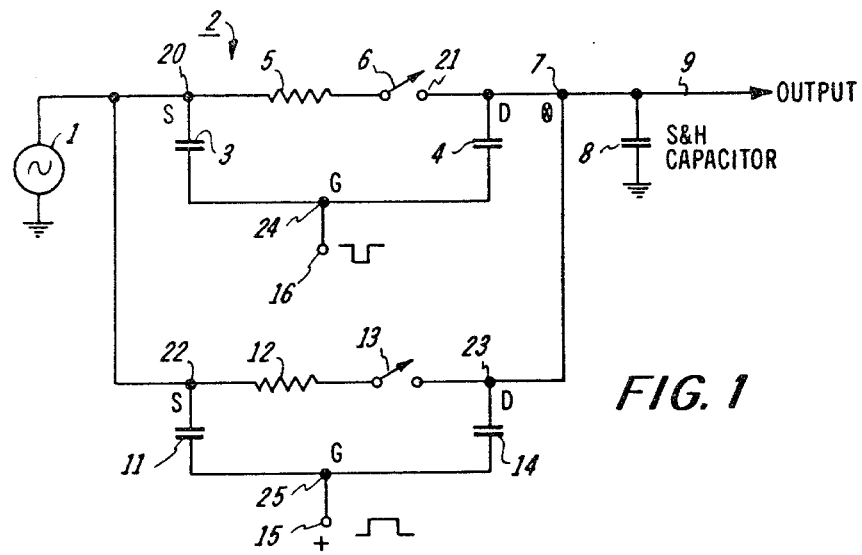
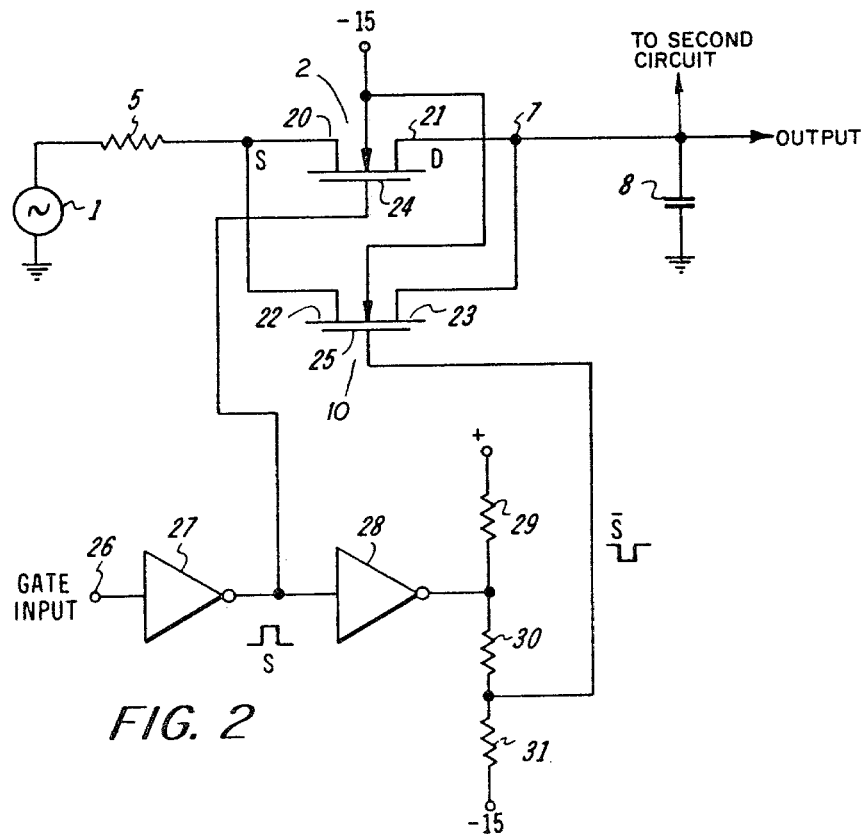

DUAL-FET SAMPLE AND HOLD CIRCUIT

BACKGROUND OF THE INVENTION

This invention is an improved sample-and-hold circuit.

A sample-and-hold circuit is commonly used to "hold" at its output for a predetermined time the voltage that was applied to its input during a short "sampling" period, usually during that time immediately prior to the holding period. Commonly, a variable voltage is applied to the input, a pulse is applied to initiate a sampling period, and the output will continue for some period to output the input voltage level that existed at the time of the pulse. A problem inherent in this type of circuit is that the sampling pulse is coupled through to the output line, which impairs the accuracy of the circuit. More specifically, in an uncompensated sample-and-hold circuit, during the sampling period the output voltage is an accurate representation of the input voltage, but, at the end of that period, the trailing edge of the sampling pulse is coupled through the gate-to-drain capacitance to the output, resulting in a dc offset or "hold step". This is especially true in high speed circuits. A complex and necessarily expensive circuit could be designed to minimize this effect. What is required is a simple circuit that would accomplish this result.

SUMMARY OF THE INVENTION

The described circuit accomplishes this objective by using an FET which, when closed, acts as a switch to charge up a capacitor during the sampling period. At the end of the sampling period, this FET opens, and the value stored at the output capacitor is then available as the circuit output. However, the sampling pulse, applied to the FET gate, is also coupled through to the capacitor and appears as a low amplitude dc offset on the output line.

To compensate for this, a second FET is provided. This one also is coupled to the output line, and receives the sampling pulse at its gate. However, it is biased so that it never turns on. The result is that this FET does not interfere with the operation of the first FET, but the sampling pulse is coupled through this FET to the output line. By using a sampling pulse for the second FET opposite in polarity but identical in timing to the first, the two pulses will cancel at the mutual output line. The result is a simple sample-and-hold circuit which can operate with accuracy at high speeds.

BRIEF DESCRIPTION OF THE DRAWINGS

FIG. 1 is a simplified equivalent drawing of the circuit.

FIG. 2 is a schematic diagram of the circuit.

DETAILED DESCRIPTION OF THE INVENTION

Figure 3:
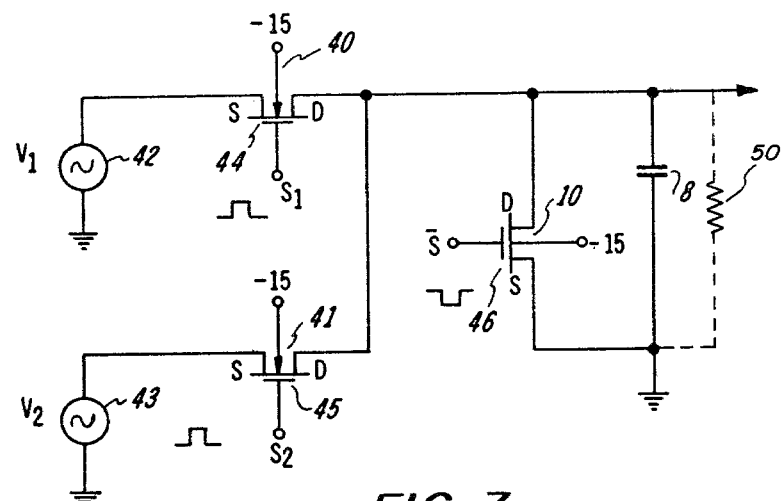
FIG. 3 is a schematic diagram of a multiplexing sample-and-hold circuit.

The equivalent circuit of FIG. 1 operates to hold an instantaneous voltage supplied by any voltage source 1 at the time of two input sampling pulses applied to the input lines 15, 16 at the output 9.

This instantaneous input voltage is applied to the first FET 2 at its source 20. The FET 2 is shown in its equivalent form, with a capacitance 3 coupling source 20 and gate 24, and also with a capacitance 4 coupling the gate 24 and drain 21. The series resistance 5 is shown as a resistor and the operation of the FET is approximated by the switch 6.

During the sampling period, the input pulse at the gate 24 closes the switch 6, allowing the output capacitor 8 to follow the input voltage supplied by the voltage source 1. At the end of the sampling pulse, the switch 6 opens, and the output capacitor 8 maintains its charge to produce the output voltage.

In addition to this sampled voltage, the pulse, applied at input 16 is coupled through the gate-to-drain capacitance 4, and also appears on the output line 9 as a noise pulse and hold step.

To compensate, a second FET 10 is provided. This FET has the identical structure, a source 22 to gate 25 capacitance 11, a gate 25 to drain 23 capacitance 14, a series resistance 12 and a series switch 13. However, a bias is applied at the input 15 so that the FET is always open, and therefore this FET 10 is not in the charge path of the output capacitor 8. However, a pulse of opposite polarity to the one applied to input 16 is applied to input 15 and is coupled to the output line 9.

The outputs of both circuits are tied at point 7 which acts as a summing junction, cancelling the pulses. Thus, at the output 9, the sampled voltage is available but the coupled-through pulses are cancelled out.

The actual circuit is shown in FIG. 2. A variable voltage from a signal input 1 is applied at FET 2 through the series resistance 5 to the source 20. During the sampling time a pulse is also supplied from the gate input 26 through any suitable amplifier 27 to the gate 24. The FET turns on, allowing the output capacitor 8 to charge.

The output of amplifier 27 is inverted in a second amplifier 28 and applied through a resistance network comprising three resistors 29,30,31 to the gate 25 of a second FET 10. The resistance network 29,30,31 is coupled to a voltage selected so that the second FET 10 will never turn on. However, the pulse at the gate 25 is coupled through the capacitance of the FET 10 to the FET 2 source 22 and drain 23 and from there to point 7 where the pulses coupled through both FETs are cancelled.

The resistive network 29,30,31 may be variable to allow the adjustment of the biasing voltage and the amplitude of the pulse applied to the FET 10 gate 25 to exactly cancel the pulses at point 7.

For the specific case where two or more input voltages must be multiplexed, the sample-and-hold multiplexing circuit of FIG. 3 may be used. The details of FIG. 2 apply except that there are two switching FETs 40,41 in addition to the compensating FET 10. It is assumed that the two input voltage sources 42 and 43 are independent, that the sampling pulses S1 and S2 are not present simultaneously, and that a compensating pulse S occurs for each S1 and S2 pulse. It is also assumed that the gate of the compensating FET is biased negatively as in FIG. 2 so that it remains off.

A further difference is that all FET drains in FIGS. 2 and 3 are connected, but that while the sources 20, 22 are connected in FIG. 2, the sources 44,45 are coupled through the voltage inputs 42,43 to ground, and source 46 is directly grounded.

The sample-and-hold multiplexer of FIG. 3 may be converted to a conventional multiplexer by replacing capacitor 8 with a resistor 50, shown connected to the output by dotted lines. In an uncompensated multiplexer, the sampling pulse coupled through the FET 40 capacitances to the output line will result in a noise pulse on the output line, as compared to a dc level error in an equivalent sample-and-hold circuit. In this case, compensating FET 10 operates identically to cancel the pulse at the output line.

Another embodiment of a two-channel multiplexer or sample-and-hold multiplexer is created by using the entire circuit of FIG. 2, except for capacitor 8, for each of the two channels. The output lines are connected to each other and to either a resistor or capacitor to implement a multiplexer or sample-and-hold circuit, respectively. In this case, each compensating FET 10 is connected to its corresponding switching FET 2 at both drain and source, to allow a better matching of capacitances and a better cancelling of the hold step or noise pulse.

The invention is not limited to any of the embodiments described above, but all changes and modifications thereof not constituting departures from the spirit and scope of the invention are intended to be covered by the following claims:

What is claimed is:

1. A sample-and-hold circuit of the type having a capacitor for storing an instantaneous input voltage occurring at the time of a sampling pulse input, said capacitor coupled to the output line for holding said instantaneous voltage, comprising;
    a first FET biased to turn on during said sampling pulse time, the source coupled to said input voltage, the drain coupled to said capacitor and said gate coupled to said sampling pulse, for enabling said capacitor to change to the instantaneous voltage during said sampling time, and
    a second FET, biased to remain off, the source and drain connected to the source and drain of said first FET, the gate coupled to a sampling pulse of opposite polarity and of equal timing as that coupled to the gate of said first FET, to cancel out the sampling pulses coupled through both FETs at the point where the drains are connected.

2. The circuit of claim 1 further comprising means to vary the amplitude of the sampling pulse applied to the gate of said second FET to allow the exact cancellation of said sampling pulse at said output.

3. The circuit of claim 2 further comprising means for varying the bias level of said second FET to allow the exact cancellation of said sampling pulse at said output.

4. A sample-and-hold multiplexer wherein each channel of said multiplexer comprises the circuit of claim 1, and wherein said output lines are connected.

5. A multiplexing sample-and-hold circuit of the type having a capacitor on the output line comprising:
    a first FET, the source connected to a first input voltage, the gate connected to a first sampling pulse, and a drain connected to said capacitor,
    a second FET, the source connected to a second input voltage, the gate connected to a second sampling pulse, and a drain connected to said capacitor, and
    a compensating FET, the gate connected to a source of two pulses, equal in timing and of opposite polarity to the first and second sampling pulses, and the drain connected to the drains of said first and second FETs.

6. The circuit of claim 5 further comprising means for varying the bias level of said compensating FET and means for varying the amplitude of the pulses applied to the gate of said compensating FET.

7. A multiplexer of the type having a resistor on the output line comprising:
    a first FET, the source connected to a first input voltage, the gate connected to a first sampling pulse, and a drain connected to said resistor,
    a second FET, the source connected to a second input voltage, the gate connected to a second sampling pulse, and a drain connected to said resistor, and
    a compensating FET, the gate connected to a source of two pulses, equal in timing and of opposite polarity to the first and second sampling pulses, and the drain connected to the drains of said first and second FETs.

8. The circuit of claim 7 further comprising means for varying the bias level of said compensating FET and means for varying the amplitude of the pulses applied to the gate of said compensating FET.

* * * * *